(12) United States Patent
Peng et al.

(10) Patent No.: US 10,202,278 B2
(45) Date of Patent: Feb. 12, 2019

(54) SEMICONDUCTOR STRUCTURE WITH CAVITY SPACING MONITORING FUNCTIONS (71) Applicant: TAIWAN SEMICONDUCTOR MANUFACTURING COMPANY LTD., Hsinchu (TW)

(72) Inventors: Jung-Huei Peng, Hsinchu Hsien (TW); Yi-Chien Wu, Taichung (TW); Yu-Chia Liu, Kaohsiung (TW); Chun-Wen Cheng, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 62 days.

(21) Appl. No.: 15/255,606

(22) Filed: Sep. 2, 2016

(65) Prior Publication Data

US 2018/0065841 A1 Mar. 8, 2018

(51) Int. Cl.
*B81B 7/00* (2006.01)
*B81C 1/00* (2006.01)
*B81C 99/00* (2010.01)

(52) U.S. Cl.
CPC ................. *B81C 99/0045* (2013.01)

(58) Field of Classification Search
CPC ........................................................ H01J 9/24
USPC .............................. 257/415; 345/83; 438/118
See application file for complete search history.

(56) References Cited

U.S. PATENT DOCUMENTS

| 6,262,528 | B1* | 7/2001 | Kim ..................... H01J 9/242 |
| | | | 313/495 |
| 6,536,281 | B2* | 3/2003 | Abe ....................... B81B 7/007 |
| | | | 73/504.16 |
| 8,987,059 | B2 | 3/2015 | Liang et al. |
| 9,040,334 | B2 | 5/2015 | Chu et al. |
| 9,065,358 | B2 | 6/2015 | Tsai et al. |
| 9,085,455 | B2 | 7/2015 | Cheng et al. |
| 9,085,456 | B2 | 7/2015 | Tsai et al. |
| 9,122,827 | B2 | 9/2015 | Chen et al. |
| 9,133,017 | B2 | 9/2015 | Liang et al. |
| 9,138,994 | B2 | 9/2015 | Peng et al. |
| 9,139,420 | B2 | 9/2015 | Chang et al. |
| 9,139,423 | B2 | 9/2015 | Chien et al. |
| 9,181,083 | B2 | 11/2015 | Tsai et al. |
| 9,187,317 | B2 | 11/2015 | Cheng et al. |
| 9,233,839 | B2 | 1/2016 | Liu et al. |

(Continued)

*Primary Examiner* — Sheng-Bai Zhu
(74) *Attorney, Agent, or Firm* — WPAT, P.C., Intellectual Property Attorneys; Anthony King (57) ABSTRACT

The present disclosure provides a semiconductor structure. The semiconductor structure includes a cavity disposed in a substrate and enclosed by a first surface and a second surface opposite to the first surface. The semiconductor structure also includes a first electrode pair having a first electrode on the first surface and a second electrode on the second surface. The first electrode pair is configured to measure a first spacing between the first surface and the second surface. The semiconductor structure further includes a second electrode pair having a third electrode on the first surface and a fourth electrode on the second surface. The second electrode pair is configured to measure a second spacing between the first surface and the second surface.

20 Claims, 8 Drawing Sheets

(56) References Cited

U.S. PATENT DOCUMENTS

| | | |
|---|---|---|
| 9,236,877 B2 | 1/2016 | Peng et al. |
| 9,238,581 B2 | 1/2016 | Wu et al. |
| 2005/0078348 A1* | 4/2005 | Lin .................... B81C 1/00801 359/291 |
| 2006/0183644 A1* | 8/2006 | Nakamura ........... G02B 26/001 505/210 |
| 2008/0088911 A1* | 4/2008 | Miles ................... G02B 26/001 359/291 |
| 2008/0174532 A1* | 7/2008 | Lewis .................. G09G 3/3433 345/85 |
| 2011/0177745 A1* | 7/2011 | Lasiter ................ G02B 26/001 445/24 |
| 2012/0038372 A1* | 2/2012 | Reinmuth ........... B81C 1/00142 324/661 |
| 2014/0022643 A1* | 1/2014 | Hirokubo .................. G01J 3/26 359/578 |
| 2014/0110259 A1* | 4/2014 | Takahashi ........ G01N 33/48721 204/452 |
| 2014/0287548 A1 | 9/2014 | Lin et al. |
| 2015/0137303 A1 | 5/2015 | Chou et al. |
| 2015/0175405 A1 | 6/2015 | Cheng |
| 2015/0175407 A1 | 6/2015 | Cheng et al. |
| 2015/0196912 A1 | 7/2015 | Tsai et al. |

\* cited by examiner

SEMICONDUCTOR STRUCTURE WITH CAVITY SPACING MONITORING FUNCTIONS

BACKGROUND

Micro-electro mechanical system (MEMS) devices include devices fabricated using semiconductor technology to form miniature mechanical and electrical features. As technologies evolve, designs for MEMS devices are becoming more complicated in regard to smaller dimensions and an increase of functionality and the amount of circuitries. Numerous manufacturing operations are implemented within such small and high performance semiconductor devices. The manufacturing of MEMS devices in a continually-decreased scale is becoming more complicated, and the increase in complexity of manufacturing may cause deficiencies such as high yield loss, poor reliability of the electrical interconnection, low testing coverage, etc. Therefore, there is a need to modify the structure and manufacturing method of MEMS devices in order to improve device durability as well as reduce manufacturing cost and processing time.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure presents a semiconductor device and manufacturing method thereof, in which a cavity monitoring mechanism is provided for a semiconductor structure of MEMS devices. Measurement for the spacing values at different locations of the cavity are conducted in order to ensure the tolerance and uniformity for the different spacing values across the cavity. An improved cavity monitoring performance and reduced cost for manufacturing the MEMS devices thereof are obtained.

Figure 1:
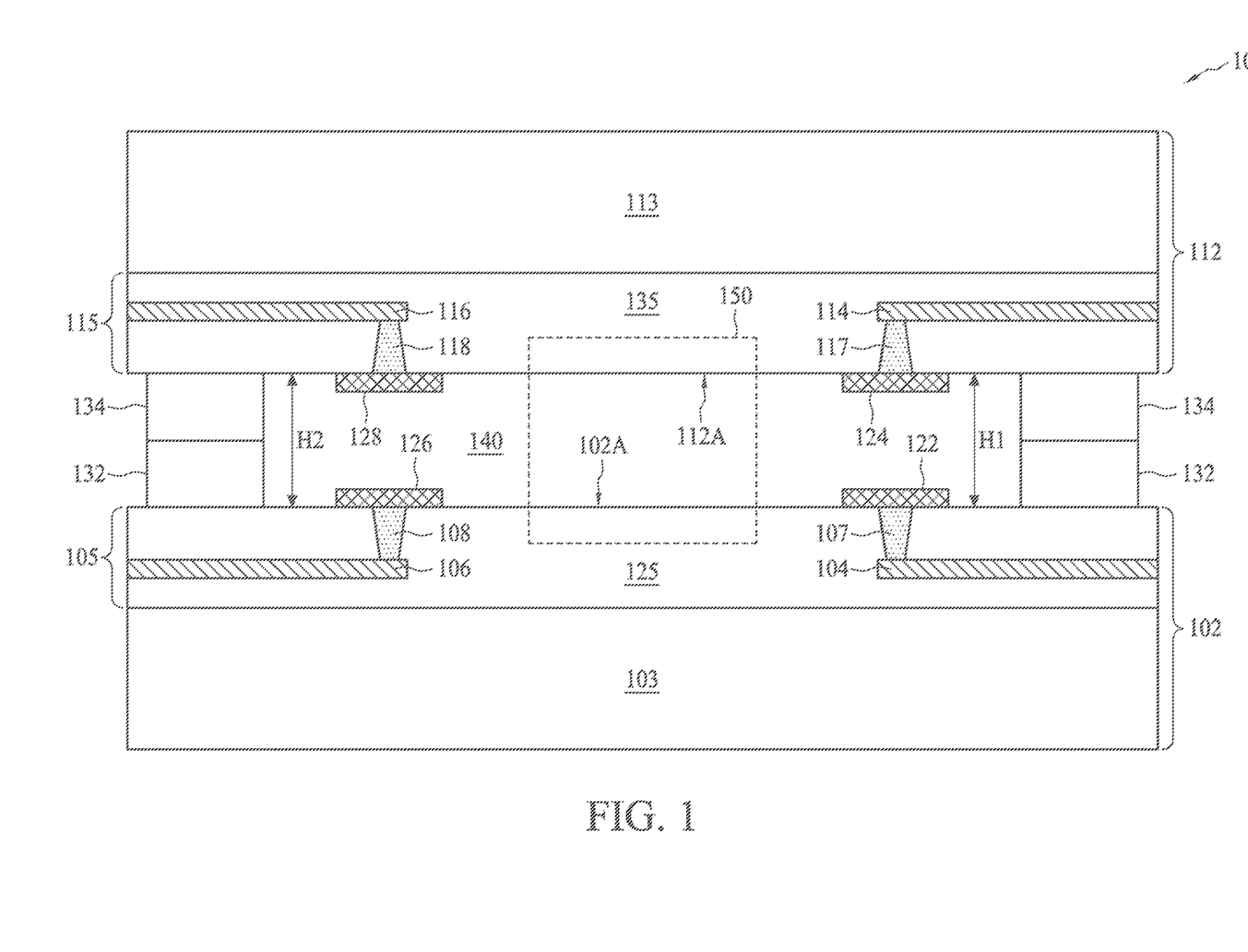
FIG. 1 is a schematic cross-sectional view of a semiconductor structure in accordance with various embodiments of the present disclosure.

FIG. 1 is a schematic cross-sectional view of a semiconductor structure 100 in accordance with various embodiments of the present disclosure. The semiconductor structure 100 may be part of a MEMS device, where exemplary MEMS devices include gears, levers, valves, hinges, etc. In addition, the semiconductor structure 100 may find MEMS applications such as accelerometers, pressure sensors, actuators, mirrors, heaters, and printer nozzles. In some embodiments, the semiconductor structure 100 may be formed for an optical element, such as an optical waveguide, an interferometric actuator, or a diffractive optical element. In some embodiments, at least one component of the semiconductor structure 100 is transparent or quasi-transparent in order to transmit or relay optical signals through the semiconductor structure 100.

Referring to FIG. 1, the semiconductor structure 100 comprises a first substrate 102, a second substrate 112, bonding pads 132 and 134, and a cavity 140 formed between the first substrate 102 and the second substrate 112. Additionally, the semiconductor structure 110 includes electrodes 122, 124, 126 and 128 disposed in the cavity 140.

The first substrate 102 includes a first semiconductor material 103 and a first interconnect structure 105. The first semiconductor material 103 may comprise silicon. In some embodiments, the first semiconductor material 103 may include other semiconductor materials, such as silicon germanium, silicon carbide, gallium arsenide, or the like. In some embodiments, the first semiconductor material 103 is a p-type semiconductive substrate (acceptor type) or n-type semiconductive substrate (donor type). Alternatively, the first semiconductor material 103 includes another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the first semiconductor material 103 is a semiconductor-on-insulator (SOI).

The first substrate 102 may include passive components, such as diodes, resistors, capacitors and inductors, formed in the first semiconductor material 103. In addition, the first substrate 102 may include active components, such as transistors or other circuits, formed in the first semiconductor material 103. The active and/or passive components in the first semiconductor material 103 are designed for communicating electrical signals through the interconnect structure 105. Accordingly, converted data taking an electrical form such as voltage values or current values associated with the measurements or configurations for the semiconductor structure 100 can be transmitted.

The first interconnect structure 105 is disposed over the first semiconductor material 103. In some embodiments, the first interconnect structure 105 is formed in the first semiconductor material 103. The first interconnect structure 105 is configured to electrically couple electrical components within the first semiconductor material 103. In some embodiments, the first interconnect structure 105 is configured to electrically couple the first semiconductive substrate 103 with a component in the cavity 140. In the present embodiment, the first interconnect structure 105 electrically couples the electrodes 122 and 126 with the first semiconductor substrate 103.

The first interconnect structure 105 may include at least one conductive layer. Each of the conductive layers may include conductive wires or lines and is electrically coupled to an adjacent overlaying or underlying conductive layer through at least one conductive via. In the present embodiment, conductive layers 104 and 106 are shown in a layered structure and connected to the electrodes 122 and 126 through respective conductive vias 107 and 108. In some embodiments, the conductive layers 104 and 106, and the conductive vias 107 and 108 are formed with conductive materials, such as nickel, copper, silver, tungsten, gold, or the like. The conductive layers 104 and 106 may be conductvely interconnected or disconnected depending on the applications. The conductive layers and vias of the first interconnect structure 105 are provided for illustration. Other numbers of conductive layers, conductive vias, or conductive wires and alternative wiring patterns are also within the contemplated scope of the present disclosure. For example, a multi-layered conductive structure may be formed over each other and joined with conductive vias.

Moreover, the aforesaid conductive layers and conductive vias are electrically insulated from other components. The insulation may be achieved by insulating materials. In some embodiments, the remaining portion of the second interconnect structure 105 may be filled with a first dielectric material 125. The first dielectric material 125 may be formed of oxides, such as un-doped Silicate Glass (USG), Fluorinated Silicate Glass (FSG), low-k dielectric materials, or the like. The low-k dielectric materials may have k values lower than 3.8, although the dielectric material 125 may also be close to 3.8. In some embodiments, the k values of the low-k dielectric materials are lower than about 3.0, and may be lower than about 2.5.

The second substrate 112 is disposed over the first substrate 102. The second substrate includes a second semiconductor material 113 and an interconnect structure 115. The second semiconductor material 113 is disposed over the second interconnect structure 115. In some embodiments, the second interconnect structure 115 is formed in the second semiconductor material 113. The second interconnect structure 115 is configured to electrically couple electrical components within the second semiconductor material 113. In some embodiments, the second interconnect structure 115 is configured to electrically couple the second semiconductor material 113 with a component in the cavity 140. In the present embodiment, the second interconnect structure 115 electrically couples the electrodes 124 and 128 with the second semiconductor material 113. In some embodiments, the second interconnect structure 115 includes configurations and materials similar to the first interconnect structure 105.

In some embodiment, conductive layers 114 and 116 are shown in a layered structure and connected to the electrodes 124 and 128 through respective conductive vias 117 and 118. In some embodiments, the conductive layers 114 and 116 may be conductively interconnected or disconnected depending on the applications. The conductive layers and vias of the first interconnect structure 115 are provided for illustration. Other numbers of conductive layers, conductive vias, or conductive wires and alternative wiring patterns are also within the contemplated scope of the present disclosure. For example, a multi-layered conductive structure may be formed over each other and joined with conductive vias.

Additionally, the remaining portion of the second interconnect structure 115 may be filled with a second dielectric material 135. The second dielectric material 135 may be formed of oxides, such as un-doped Silicate Glass (USG), Fluoridated Silicate Glass (FSG), low-k dielectric materials, or the like. The second dielectric material 135 may be the same as or different from the first dielectric material 125.

The second semiconductor material 113 may comprise silicon. In some embodiments, the second semiconductor material 113 may include other semiconductor materials, such as silicon germanium, silicon carbide, gallium arsenide, or the like. Alternatively, the second semiconductor material 113 includes another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsF, AlInAs, AlGaAs, GaInAs, GaInP, and/or GaInAsP; or combinations thereof. The second semiconductor material 113 may contain materials the same as or different from the first substrate material 103.

In some embodiments, second semiconductor material 113 may further include passive components such as diodes, resistors, capacitors and inductors, or active components such as transistors or other circuits. In some embodiments, the components in the second semiconductor material 113 may be conductively coupled to those components in the first semiconductor material 103.

The first substrate 102 and the second substrate 112 are disposed in a face-to-face fashion. The cavity 140 is formed between the first substrate 102 and the second substrate 112. In an embodiment, the cavity 140 is enclosed by a surface 102A of the first substrate 102 and a surface 112A of the second substrate 112. In some embodiments, the cavity 140 is generated within a substrate (e.g., made of layered substrates 102 and 112) where internal walls are formed as the surfaces 102A and 112A. In some embodiments, several bonding pads 132 are disposed on the first substrate 102. Furthermore, several bonding pads 134 are disposed on the second substrate 112. The bonding pads 132 may be electrically bonded to corresponding bonding pads 134 and the cavity 140 is formed accordingly. In some embodiments, the cavity 140 may be a vacuum space or contain air.

In some embodiments, the bonding pads 132 and 134 include electrical bonding materials, such as a eutectic bonding material, solder bonding material, or the like. In some embodiments, the bonding pads 132 and 134 include aluminum, copper, silicon, germanium, titanium, tantalum, gold, nickel, tin, or the like in performing eutectic bonding. In some embodiments, the bonding pads 132 and 134 may respectively include a metallic material (e.g., aluminum, copper, titanium, tantalum, gold, nickel, or tin) and a semiconductor material (e.g., silicon or germanium).

The semiconductor structure 100 may contain functional elements within a functional space 150 defined by the first substrate 102, the second substrate 112 and the cavity 140. Throughout the present disclosure, a term "functional element" refers to a unit, a feature, structure, combinations thereof, and mechanically or electrically coupled to the neighboring elements in the semiconductor structure 100. In addition, the functional element is configured to receive external stimuli, such as changes of motions, or configured to allow input signals to travel in the cavity (e.g., through optical reflection or refraction). It is understood that the functional element may occupy a tangible area or space (e.g., space 150) and conduct the designed functions, while other components of the semiconductor structure 100 (such as those away from the space 150) may cooperate with the functional elements in order to accomplish the function. Exemplary functional elements may include an optical waveguide structure over which a major portion of light transverses. Alternatively, another functional element may be a membrane for an accelerometer MEMS in which a movable component is disposed within the functional space 150 and configured to oscillate in response to external stimuli. Other components not configured to receive the input stimuli may be disposed away from the space 150. Several embodiments of the functional elements would be introduced later.

In some embodiments, the first surface 102A and the second surface 112A of the cavity 140 are planar. In some embodiments, the first surface 102A and the second surface 112A are substantially in parallel such that a signal channel can be provided with a uniform spacing. In the application of optical signal transmissions, the requirements for the planarity of the surfaces 102A and 112A, and the spacing uniformity of the cavity 140 may be higher than in other non-optical applications, e.g., an electrical signal scenario. For example, a comprehensive measurement and monitoring mechanism across the entire cavity 140 may be required. Thus, as shown in FIG. 1, spacing measurements are taken at multiple locations, such as a first spacing H1 and a second spacing H2 adjacent to opposite sides of the cavity 140, in order to ensure an acceptable optical transmission performance. In some embodiments, those locations are independently disposed in separate segments of the cavity 140. The first spacing H1 and the second spacing H2 respectively represent two independent measurements of cavity spacing values at two different locations. Consequently, local variations of cavity spacing can be detected via independent measurements for the first spacing H1 and the second spacing H2 which are obtained.

In some embodiment, electrodes 122 and 124 are disposed on the respective surfaces 102A and 112A. Further, electrodes 122 and 124 may form a first electrode pair configured to measure the first spacing H1 of the cavity 140. The electrodes 122 and 124 serve as two conductive plates of a first capacitor with the spacing H1 acting as a plate separation therebetween. Accordingly, a capacitance value in inverse proportional to the spacing H1 is generated in response to an input signal. The first electrode pair may be coupled to a signal collector (not shown) through the interconnect structures 103 and 105 where the capacitance value is derived and transmitted. Similarly, in some embodiment, electrodes 126 and 128 are disposed on the respective surfaces 102A and 112A. Further, electrodes 126 and 128 may form a second electrode pair disposed apart from the first electrode pair (i.e., the electrodes 122 and 124), and configured to measure the second spacing H2 of the cavity 140. The electrodes 126 and 128 serve as two conductive plates of a second capacitor with the spacing H2 acting as the plate separation therebetween. Accordingly, another capacitance value in inverse proportional to the spacing H2 is generated, derived and provided to a signal collector through the interconnect structures 103 and 105.

The electrodes 122, 124, 126 and 128 are made with conductive materials. In some embodiments, the electrodes 122, 124, 126 and 128 are made with aluminum, copper, titanium, tantalum, gold, nickel, tin, alloys thereof or the like. In some embodiments, the electrodes 122, 124, 126 and 128 are made with doped semiconductive material, such as p-type silicon or n-type silicon.

In some embodiments, the monitoring electrodes 122, 124, 126 and 128 are disposed vertically non-overlapped with the functional element in the functional area 150 such that the functional element may operate normally. In some embodiments, the interconnect structures 105 and 115, which are electrically coupled with the monitoring electrodes, are disposed away from the functional element and the functional space 150. In some embodiments, the interconnect structures 105 and 115 are vertically non-overlapped with the functional element or the functional space 150.

Figure 2A:
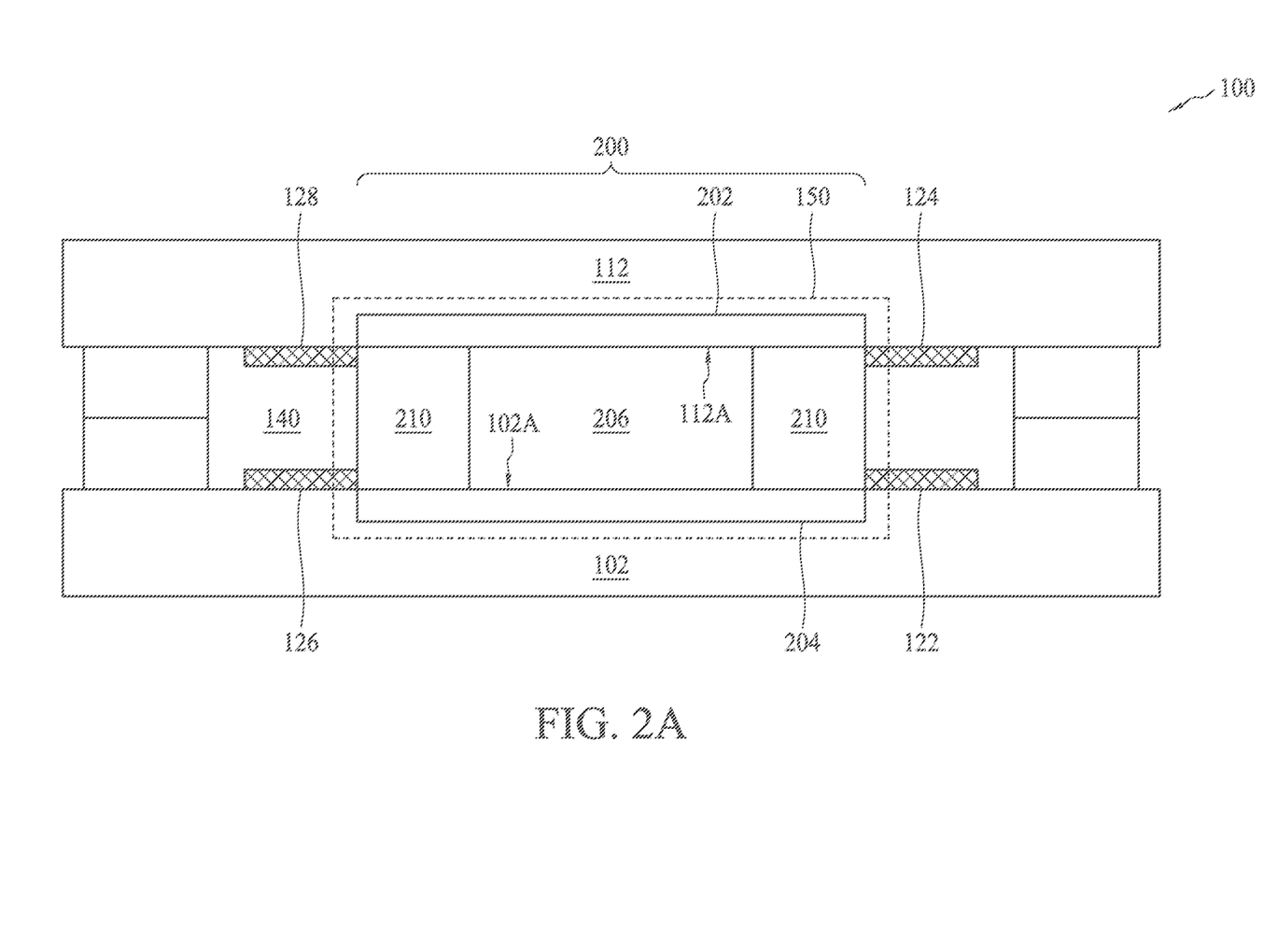
FIG. 2A-2E are schematic views of a functional element 200 for the semiconductor structure in FIG. 1 in accordance with various embodiments of the present disclosure.

FIG. 2A is a schematic view of a functional element 200 for the semiconductor structure 100 in FIG. 1 in accordance with various embodiments of the present disclosure. In some embodiments, the functional element 200 includes an optical waveguide. The functional element 200 includes a first cladding layer 202, a second cladding layer 204, and a core layer 206.

In some embodiments, the first cladding layer 202 and the second cladding layer 204 comprise planar surfaces. Optical signals may propagate between the first cladding layer 202 and the second cladding layer 204 through reflection or diffraction. The core layer 206 is enclosed by the first cladding layer 202 and the second cladding layer 204. In addition, optical signals propagate within the core layer 206 along a direction parallel to the surface 112A and 102A, and substantially perpendicular to the paper.

In some embodiments, the materials for the first cladding layer 202 and the second cladding layer 204 have a refractive index greater than that of the core layer 206 in order to fulfill the requirement of total internal reflection. In some embodiments, the first cladding layer 202 and the second cladding layer 204 are formed of a metallic material with the core layer filled with air. In some embodiments, the first cladding layer 202 and the second cladding layer 204 are formed of a polymer material, such as silicon dioxide, while the core layer 206 is made of $Al_2O_3$, BK7, SiON or phosphorus silica glass (PSG). In some embodiments, the first cladding layer 202 may be formed with a material different from the second cladding layer 204.

In some embodiments, the functional element 200 further comprises spacers 210 between the first cladding layer 202 and the second cladding layer 204. The first cladding layer 202 and the second cladding layer 204 are used for confining and concentrating the optical signals (such as light) within the functional element 200. In some embodiments, the spacers 210 are formed with materials same as the first cladding layer 202 or the second cladding layer 204.

Figure 2B:
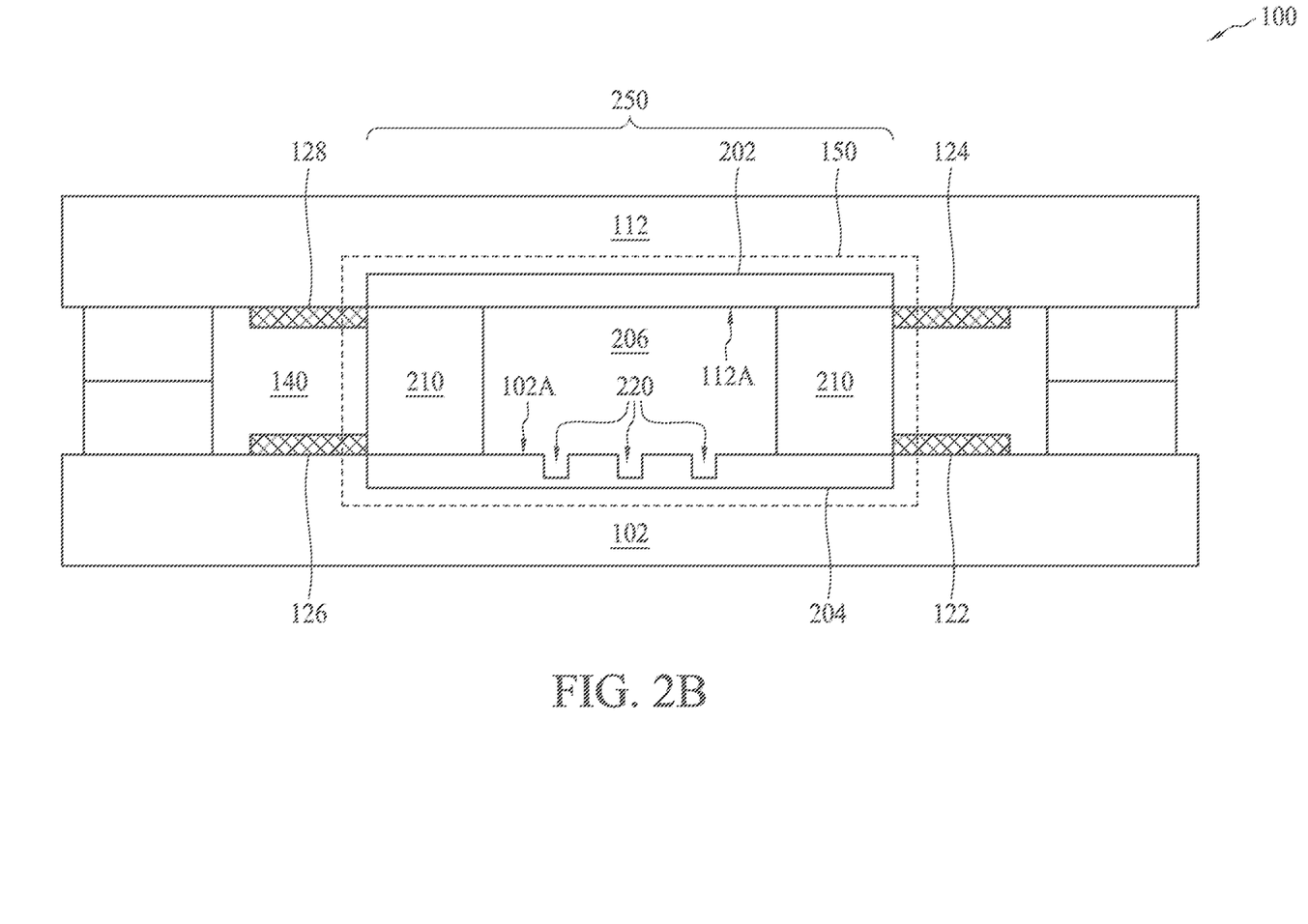

FIG. 2B is a schematic view of another functional element 250 for the semiconductor structure 100 in FIG. 1 in accordance with various embodiments of the present disclosure. In some embodiments, the functional element 250 is one type of an optical waveguide or diffractive element. Comparing FIG. 2A and FIG. 2B, the functional element 250 comprises at least one trench 220 on the surface 102A of the second cladding layer 204. In some embodiments, the trench 220 is formed on the surface 112A of the first cladding layer 202. In the present embodiment, the trenches 220 are formed in parallel and extended along a direction in which the light propagates. In some embodiments, the parallel trenches 220 are extended perpendicular to the direction in which the light propagates.

Figure 2C:
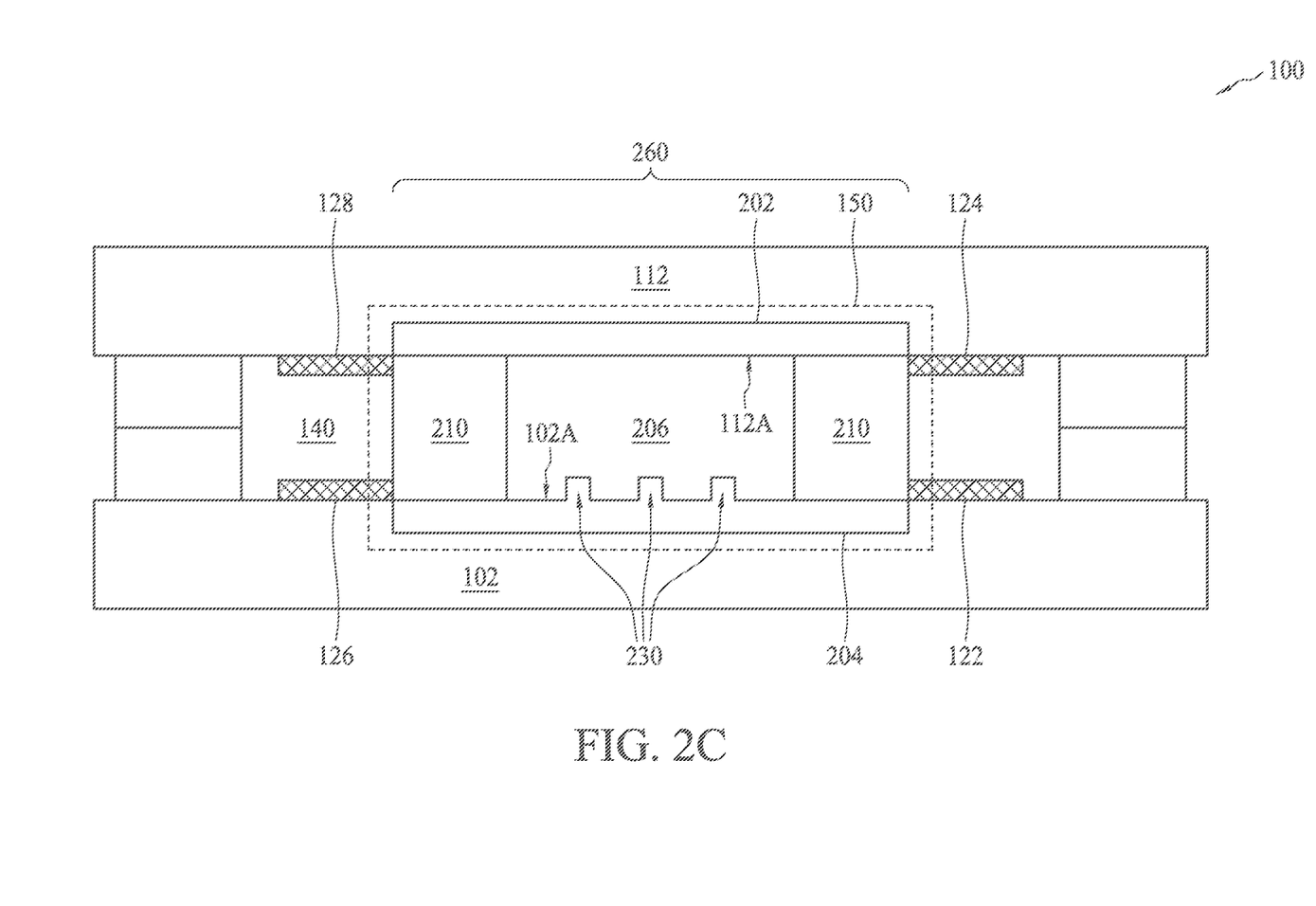

FIG. 2C is a schematic view of yet another functional element 260 for the semiconductor structure 100 in FIG. 1 in accordance with various embodiments of the present disclosure. Comparing FIG. 2B with FIG. 2C, the functional element 260 comprises at least one ridge 230 on the surface 102A of the second cladding layer 204. In some embodiments, the ridge 230 is formed on the surface 112A of the first cladding layer 202. In the present embodiment, the ridges 230 are formed in parallel and extended along a direction in which the light propagates. In some embodiments, the ridges 230 are extended perpendicular to the direction in which the light propagates.

Figure 2D:
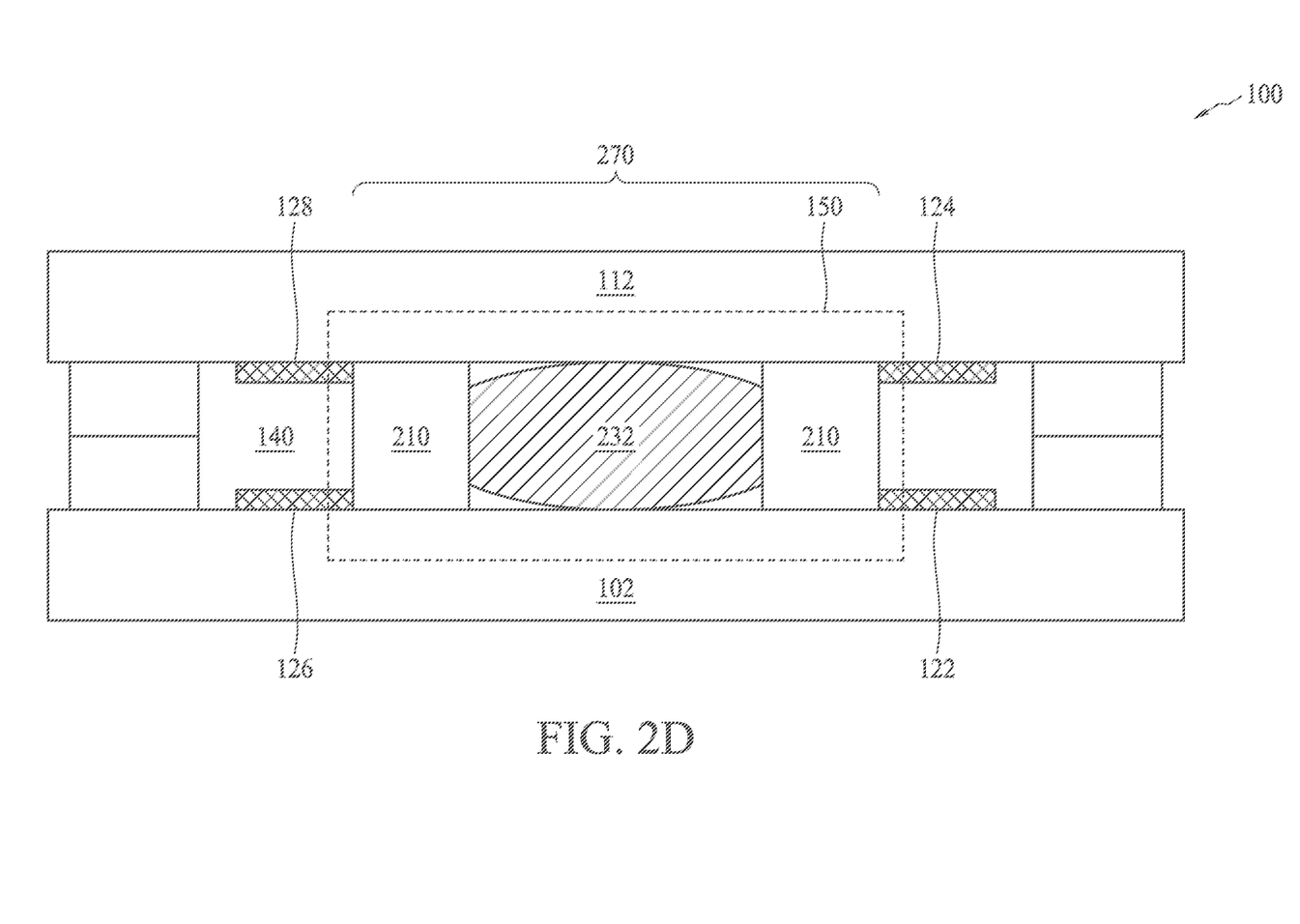

FIG. 2D is a schematic view of another functional element 270 for the semiconductor structure 100 in FIG. 1 in accordance with various embodiments of the present disclosure. The functional element 270 may be an optical diffractive element, such as a beam splitter, diffractive lens, gratings or wave front generator. The diffractive lens may include Fresnel zone lenses, cylindrical lenses or a lens array. In some embodiments, the functional element 270 shown in FIG. 2D may comprise a convex lens or convex lens with a curved surface upon which the optical signal impinges and passes through the functional element 270. The optical signal can thus be shaped into desired patterns.

Figure 2E:
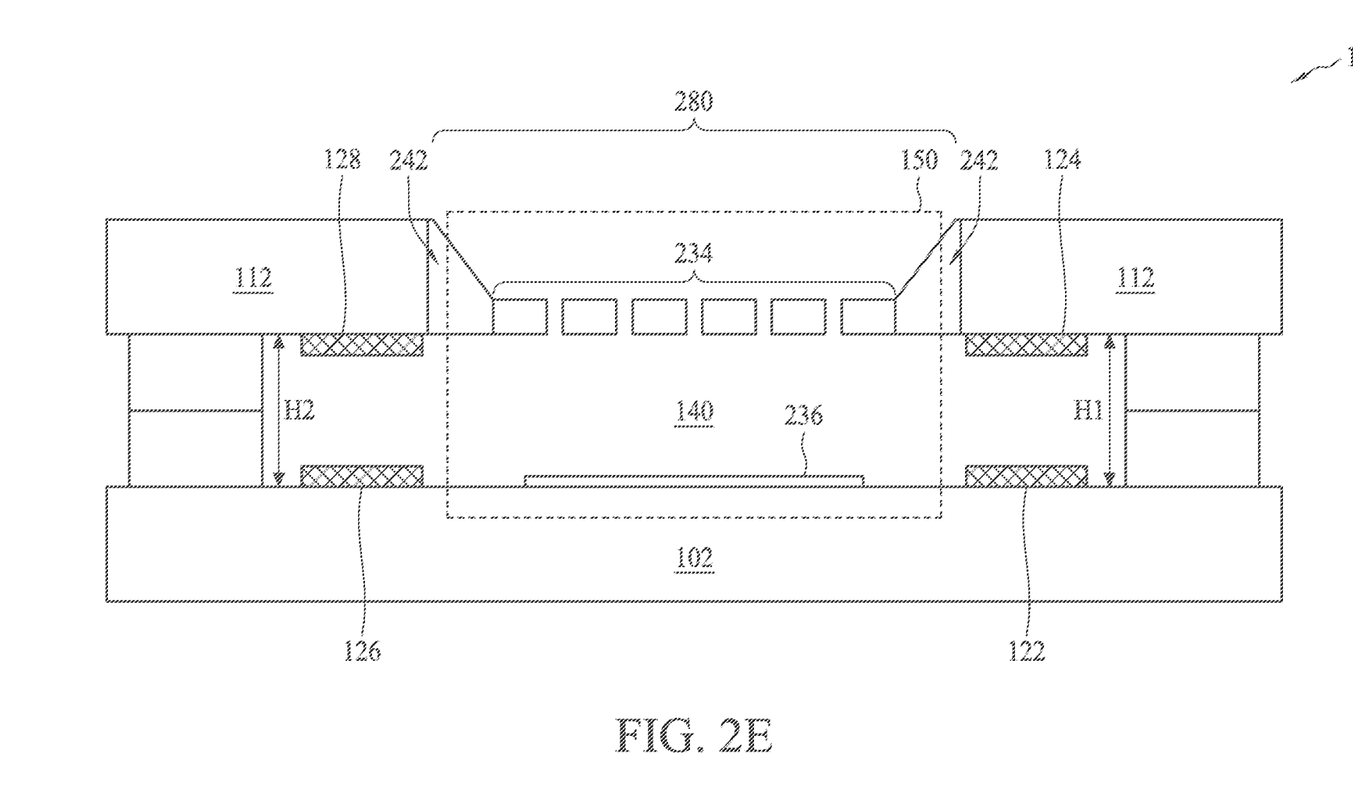

FIG. 2E is a schematic view of another functional element 280 for the semiconductor structure 100 in FIG. 1 in accordance with various embodiments of the present disclosure. In some embodiments, the functional element 280 may comprise sensing elements for sensor applications, such as an accelerometer, microphone, pressure sensor, gyroscope, and the like. The functional element 280 comprises a movable component 234 on the surface 112A and a sensing electrode 234 on the surface 102A. The movable component 234 may be a pliable film or membrane that can be bent or oscillated in response to stimuli. In some embodiments, the movable component 234 comprises an electrode, which is designed to form a sensing electrode pair in conjunction with the bottom electrode 236. The first substrate 102 and the second substrate 112 include inflexible portions 242 around the space 150 or within the space 150. In some embodiments, the movable component 234 is joined with inflexible portions 242 of the second substrate 112 on two ends. The cavity 140 is formed for the functional element 280 in which the sensing performance of the sensing electrodes 232 and 234 is dependent heavily upon the uniformity of the cavity 140. In view of the above, it is advantageous to dispose monitoring electrodes 122, 124, 126 and 128 at the locations of inflexible portions of the first substrate 102 or the second substrate 112, and measure the spacing values H1 and H2 adjacent to the functional element 280 in order to ensure proper functioning of the semiconductor structure 100.

Figure 3:
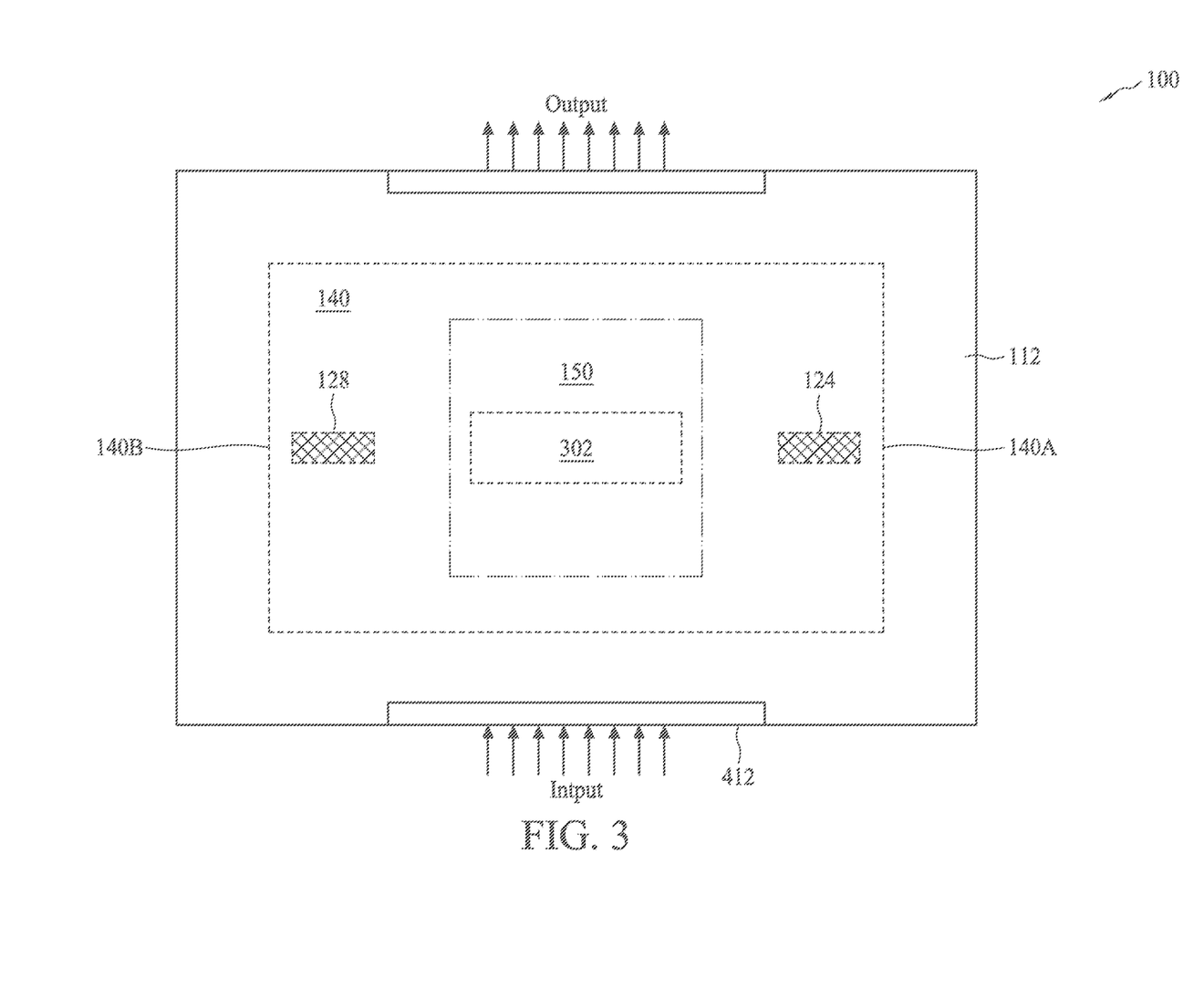
FIG. 3 is a schematic top view of the semiconductor structure in FIG. 1 in accordance with various embodiments of the present disclosure.

FIG. 3 is a schematic top view of the semiconductor structure 100 in FIG. 1 in accordance with various embodiments of the present disclosure. A top surface of the second substrate 112 is visible while other underlying features, such as the electrodes 124 and 128 and the cavity 140, are invisible from the view and illustrated with dashed lines. In addition, electrodes 122 and 126 are substantially overlapped with the corresponding electrodes 124 and 128, and thus are not separately shown for the sake of simplicity.

In some embodiments, a functional element 302 is formed within the functional space 150. The functional element 302 may be an optical reflective or diffractive element. In addition, the functional element 302 may receive optical signals from an input port of the semiconductor structure 100, e.g., from an input opening on the bottom side, and transmit the optical signals through an output port, e.g., from an output opening on the top side. On the one hand, a majority of light energy would pass through the functional space 150 of the cavity 140 in which the functional element 302 is situated. On the other hand, the electrodes 124 and 128 (also including electrodes 122 and 126) are disposed in spaces within the cavity 140 while away from the functional space 150. In some embodiments, all of the optical signals are confined within a channel formed by the functional element. In some embodiments, all of the optical signals are away from spaces in the cavity between the electrodes 122 and 124 of the first electrode pair and away from the spaces in the cavity between the electrodes 126 and 128 of the second electrode pair.

In some embodiments, the electrodes 122, 124, 126 and 128 are used for monitoring the cavity spacing only. As a result, the disposition of the first electrode pair (corresponding to electrodes 122 and 124) or the second electrode pair (corresponding to electrodes 126 and 128) would not obstruct the travelling course of the light. In a normal environment, the walls of the cavity 140 are constituted of the first substrate 102 and the second substrate 112, which are made fixed and not movable in response to external stimuli. In some embodiments, the electrodes of the first or second electrode pair are designed to monitor fixed spacing values across the walls at different locations. Therefore, the first electrode pair or the second electrode pair would not be movable in response to any stimuli.

In some embodiments, the measurement procedure of cavity spacing values via the electrodes 122 through 128 would be completed prior to the functioning of the semiconductor structure 100. For example, the semiconductor structure 100 is configured to provide measurement data of capacitance values in a final stage of the manufacturing process. Such measurement mechanism facilitates in-situ product quality checks. In addition, the embedded monitoring electrodes can eliminate the destructive inspection procedure through sampling some of the products and breaking the sealed cavity 140 in order to obtain the measurements. The overall yield for manufacturing and inspection the completed MEMS devices are improved and the costs are also decreased accordingly.

Referring again to FIG. 3, the first electrode pair (represented by the electrode 124) and the second electrode pair (represented by the electrode 128) are disposed separately. In some embodiments, the first electrode pair (represented by the electrode 124) and the second electrode pair (represented by the electrode 128) are disposed at opposite sides with respect to the functional space 150 or the functional element 302. In some embodiments, the first electrode pair and the second electrode pair are distributed across the walls of the cavity 140. In some embodiments, the first electrode pair and the second electrode pair are disposed against the sidewalls 140A and 140B, respectively, of the cavity 140. The selection of locations for the first and second electrode pairs is dependent upon the representativeness of cavity uniformity and the geometry of the electrodes.

Electrodes 124 and 128 are made of conductive materials, such as aluminum, copper, nickel, tungsten, gold or their alloys. In addition, the electrodes 124 and 128 have a rectangular shape according to some embodiments. However, the electrodes 124 and 128 for the monitoring electrode pairs may have various plate shapes, such as a round shape, a polygonal shape, or a curved strip shape.

An existing electrode pair is employed to use a pair of electrodes with relatively larger electrode area in order to capture one estimate of the cavity spacing. Such large-size electrodes are required to be fit in the cavity and overlapped with the functional elements in the functional space 150 due to insufficient cavity space. Thus, only one representative measurement is acquired which is regarded as an averaged measurement for the wide areas where the large electrode pair resides. However, the non-uniform cavity spacing values cannot be detected since they are averaged. Furthermore, additional stacked layers are required to accommodate the overlapped functional elements and monitoring electrodes. By comparison, the proposed distributed monitoring electrodes aid in providing more than one measurement results, and each of the measurements results can better represent the respective local spacing values of the cavity. The monitoring performance can be improved accordingly.

Figure 4:
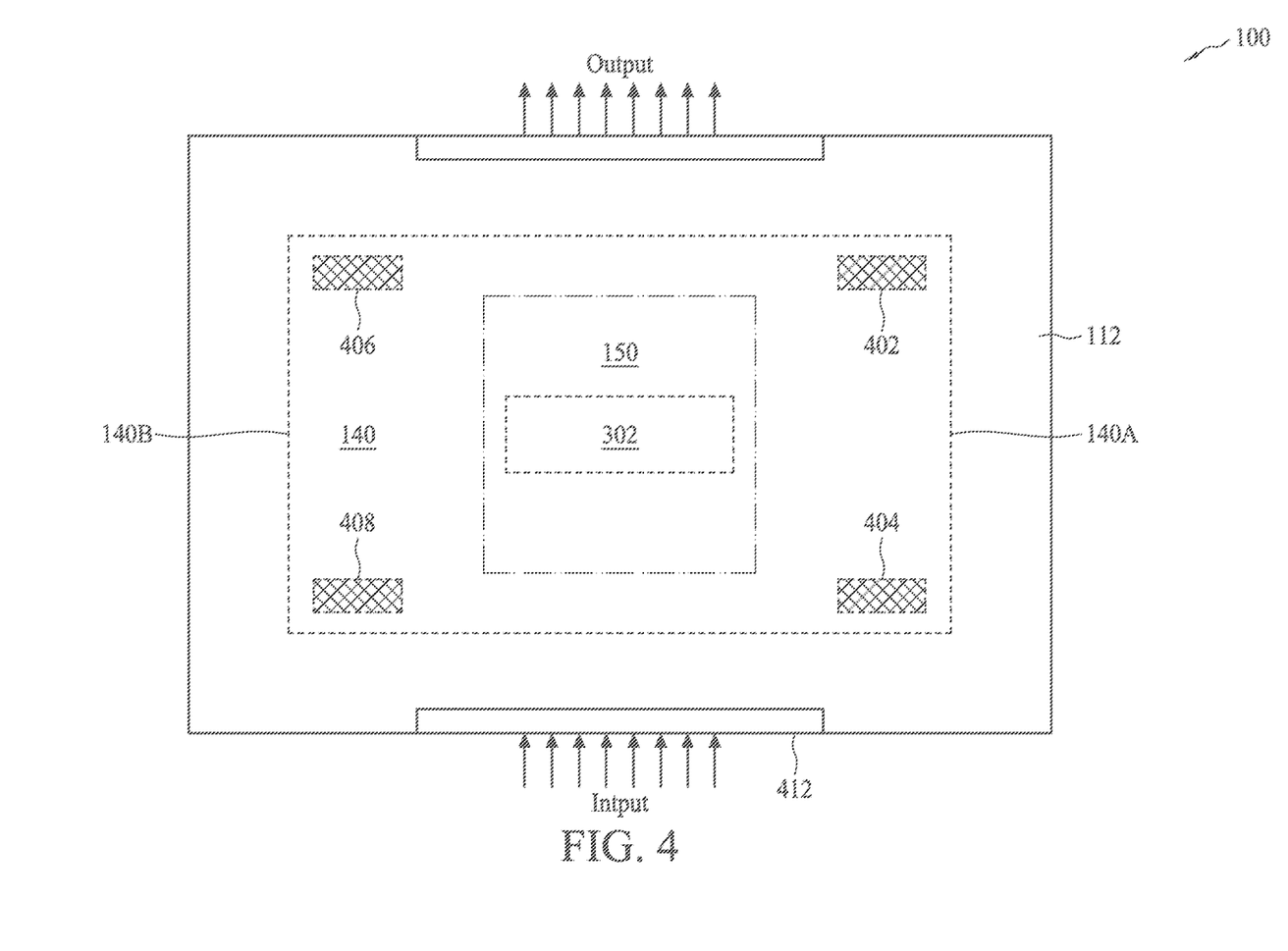
FIG. 4 is a schematic top view of a semiconductor in accordance with various embodiments of the present disclosure.

FIG. 4 is a schematic top view of a semiconductor structure 400 in accordance with various embodiments of the present disclosure. The semiconductor structure 400 is similar to the semiconductor structure 100, except for the arrangement of the monitoring electrodes. Like numbers in FIG. 3 and FIG. 4 represent similar elements and the descriptions thereof would be omitted for simplicity. Referring to FIG. 4, the semiconductor structure 400 includes a first electrode pair (represented by the electrode 402), a second electrode pair (represented by the electrode 404), a third electrode pair (represented by the electrode 406) and a fourth electrode pair (represented by the electrode 408). In other words, each of the four electrode pairs listed above comprises two electrodes in which only one electrode is schematically shown. In some embodiments, the first through fourth electrode pairs are disposed around the four corners of the cavity 140. In some embodiments, the four electrode pairs are disposed around the corners of the functional space 150. All of the four electrode pairs do not obstruct the line of propagation for the optical signals of the functional element 302. In some embodiments, the monitoring electrode pairs are distributed around the functional element from a top view. In some embodiments, the monitoring electrode pairs are distributed in an isolated manner in which the capacitance measured through each electrode pair is independent from each other. In some embodiments, each of the first, second, third and fourth the electrode pair is isolated from other electrode pairs, e.g., by the first substrate 102 or the second substrate 112. In some embodiments, the electrode pairs are conductively isolated with each other such that the capacitance results obtained from the electrode pairs are isolated with each other before they are transmitted for further processing.

The present disclosure provides a semiconductor structure. The semiconductor structure includes a cavity disposed in a substrate and enclosed by a first surface and a second surface opposite to the first surface. The semiconductor structure also includes a first electrode pair having a first electrode on the first surface and a second electrode on the second surface. The first electrode pair is configured to measure a first spacing between the first surface and the second surface. The semiconductor structure further includes a second electrode pair having a third electrode on the first surface and a fourth electrode on the second surface. The second electrode pair is configured to measure a second spacing between the first surface and the second surface.

The present disclosure provides a semiconductor structure. The semiconductor structure includes a cavity disposed in a substrate and enclosed by a first surface and a second surface opposite to the first surface. The semiconductor structure also includes a functional element in the cavity, the functional element being configured to function in response to an external stimuli outside the cavity. The semiconductor structure further includes a plurality of electrodes on at least one of the first surface and the second surface, where the plurality of electrodes are disposed adjacent to the functional element.

The present disclosure provides a semiconductor structure. The semiconductor structure includes a cavity enclosed by a first surface of a first substrate and a second surface of a second substrate. The semiconductor structure also includes a space defined by the first substrate, the second substrate and the cavity. The semiconductor further includes a component disposed within the space and configured to receive stimuli, and a plurality of electrode pairs, where each of the electrode pair comprise electrodes on the first surface and the second surface, and each of the electrode pair is configured to measure a spacing of the cavity at a location, away from the space, between the respective first electrode and the respective second electrode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor structure, comprising:
a cavity disposed in a substrate and enclosed by a first surface and a second surface opposite to the first surface;
a first electrode pair comprising a first electrode on the first surface and a second electrode on the second surface, the first electrode pair being configured to measure a first spacing between the first surface and the second surface;
a second electrode pair comprising a third electrode on the first surface and a fourth electrode on the second surface, the second electrode pair being configured to measure a second spacing between the first surface and the second surface; and
a functional element disposed within the cavity, an entirety of the functional element being non-overlapped with the first electrode pair and the second electrode pair from a top-view perspective, wherein the functional element comprises a spacer contacting the first surface and the second surface and separating the cavity from the first electrode pair and the second electrode pair.
2. The semiconductor structure of claim 1, wherein the functional element comprises an optical element configured to allow an optical signal to propagate between the first surface and the second surface.
3. The semiconductor structure of claim 2, wherein the optical element is disposed between a first location associated with the first spacing and a second location associated with the second spacing.

4. The semiconductor structure of claim 1, wherein the functional element further comprises a second spacer between the first surface and the second surface, the spacer and the second spacer being disposed on opposite sides.

5. The semiconductor structure of claim 1, further comprising a plurality of ridge structures on at least one of the first surface and the second surface.

6. The semiconductor structure of claim 5, wherein the plurality of ridges are formed in parallel with each other and extended perpendicular to a direction in which an optical signal propagates.

7. The semiconductor structure of claim 1, wherein the cavity comprises a first opening configured to receive an optical signal and a second opening configured to transmit the optical signal out of the cavity.

8. The semiconductor structure of claim 1, further comprising an interconnect structure conductively coupled to at least one of the first electrode pair and the second electrode pair.

9. The semiconductor structure of claim 8, wherein the interconnect structure is vertically non-overlapped with a functional element.

10. A semiconductor structure, comprising:
   a first substrate and a second substrate over the first substrate;
   a cavity formed by a first surface of the first substrate and a second surface of the second substrate opposite to the first surface;
   a functional element in the cavity, the functional element comprising a first cladding layer in the first substrate and a core layer between the first cladding layer and the second substrate, and the first cladding layer and the core layer comprising respective refractive indices allowing light to propagate in the core layer under total internal reflection;
   a plurality of electrodes on the first surface and the second surface, the plurality of electrodes being disposed adjacent to the functional element; and
   a spacer contacting the first surface and the second surface and separating the cavity from at least one of the first electrode pair and the second electrode pair.

11. The semiconductor structure of claim 10, wherein the first cladding layer comprises a first surface exposed through the first substrate and a second surface opposite to the first surface and contacting the first substrate.

12. The semiconductor structure of claim 10, wherein the first substrate laterally surrounds the first cladding layer.

13. The semiconductor structure of claim 10, wherein the plurality of electrodes comprise doped silicon.

14. The semiconductor structure of claim 10, wherein the plurality of electrodes are configured to form at least two electrode pairs and measure, in at least two spaced locations of the cavity, at least two spacing values of the cavity.

15. The semiconductor structure of claim 10, wherein the plurality of electrodes are configured to measure capacitance values of the cavity at different locations before the functional element receives the stimuli.

16. The semiconductor structure of claim 10, wherein the functional element further comprises a plurality of trenches on the first cladding layer and exposed to the core layer.

17. The semiconductor structure of claim 10, wherein the functional element further comprises a second cladding layer embedded in the second substrate and a second spacer between the first substrate and the second substrate, the second spacer comprising a bottom surface contacting the first cladding layer and a top surface contacting the second cladding layer.

18. A semiconductor structure, comprising:
   a cavity enclosed by a first surface of a first substrate and a second surface of a second substrate;
   a space defined by the first substrate, the second substrate and the cavity;
   a functional element disposed within the space and configured to receive stimuli;
   a plurality of electrode pairs, wherein each of the electrode pairs comprises electrodes on the first surface and the second surface, and each of the electrode pairs is non-overlapped with an entirety of the functional element from a top-view perspective and configured to measure a spacing of the cavity at a location, away from the space, between the respective first electrode and the respective second electrode; and
   a spacer contacting the first surface and the second surface and separating the cavity from the plurality of electrode pairs.

19. The semiconductor structure of claim 18, wherein the functional element comprises a cladding layer on one of the first surface and the second surface, the cladding layer being configured to direct an optical signal away from the electrodes.

20. The semiconductor structure of claim 18, wherein the plurality of electrode pairs are distributed around the space.

* * * * *